(12) United States Patent
Paik et al.

(10) Patent No.: US 11,288,587 B2
(45) Date of Patent: Mar. 29, 2022

(54) MODULAR, FREQUENCY-FLEXIBLE, SUPERCONDUCTING QUANTUM PROCESSOR ARCHITECTURE

(71) Applicant: INTERNATIONAL BUSINESS MACHINES CORPORATION, Armonk, NY (US)

(72) Inventors: Hanhee Paik, Danbury, CT (US); Jae-Woong Nah, Closter, NJ (US); Paul S. Andry, Yorktown Heights, NY (US); Martin O. Sandberg, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 356 days.

(21) Appl. No.: 16/449,239

(22) Filed: Jun. 21, 2019

(65) Prior Publication Data

US 2020/0401924 A1  Dec. 24, 2020

(51) Int. Cl.
*G06N 10/00* (2019.01)
*H01L 39/00* (2006.01)

(52) U.S. Cl.
CPC ............. *G06N 10/00* (2019.01); *H01L 39/00* (2013.01)

(58) Field of Classification Search
CPC .................................................... G06N 10/00
See application file for complete search history.

(56) References Cited

U.S. PATENT DOCUMENTS 9,524,470 B1  12/2016  Chow et al.
9,527,723 B2  12/2016  Lin et al.
9,836,699 B1  12/2017  Rigetti et al.
(Continued)

FOREIGN PATENT DOCUMENTS

WO      02084510 A2   10/2002
WO   2018212041 A1   11/2018

OTHER PUBLICATIONS

Rosenberg et al., "3D integrated superconducting qubits", Nature Partner Journals, Research Gate—2017, https://www.researchgate.net/publication/322364922, 3D_integrated_superconducting_qubits.

(Continued)

*Primary Examiner* — Matthew L Reames
(74) *Attorney, Agent, or Firm* — Henry J. Daley; Venable LLP

(57) ABSTRACT

A modular superconducting quantum processor includes a first superconducting chip including a first plurality of qubits each having substantially a first resonance frequency and a second plurality of qubits each having substantially a second resonance frequency, the first resonance frequency being different from the second resonance frequency, and a second superconducting chip including a third plurality of qubits each having substantially the first resonance frequency and a fourth plurality of qubits each having substantially the second resonance frequency. The quantum processor further includes an interposer chip connected to the first superconducting chip and to the second superconducting chip. The interposer chip has interposer coupler elements configured to couple the second plurality of qubits to the fourth plurality of qubits.

22 Claims, 6 Drawing Sheets

(56) References Cited

U.S. PATENT DOCUMENTS

| | | |
|---|---|---|
| 9,904,751 B2 | 2/2018 | Fang |
| 9,971,970 B1 | 5/2018 | Rigetti et al. |
| 2018/0012932 A1 | 1/2018 | Oliver et al. |
| 2018/0102469 A1 | 4/2018 | Das et al. |
| 2018/0114138 A1 | 4/2018 | Monroe et al. |
| 2019/0006284 A1 | 1/2019 | Brink et al. |
| 2019/0042964 A1* | 2/2019 | Elsherbini ......... H01L 29/66977 |
| 2020/0394546 A1* | 12/2020 | Bronn ................... H04L 1/0056 |

OTHER PUBLICATIONS

Vahidpour et al., "Superconducting Through-Silicon Vias for Quantum Integrated Circuits", arXiv:1708.02226v1 [physics.app-ph] Aug. 7, 2017.

Maezawa et al., " Toward Practial-Scale Quantum Annealing Machine for Prime Factoring", National Institute of Advanced Industrial Science and Technology, Tsukuba, Ibaraki, 305-8565, Japan, (Received Sep. 5, 2018).

Das et al., "Cryogenic Qubit Integration for Quantum Computing", 2018 IEEE 68th Electronic Components and Technology Conference.

PCT/2020/062751 International Search Report completed Jul. 15, 2020.

PCT/2020/062751 Written Opinion completed Jul. 15, 2020.

* cited by examiner

MODULAR, FREQUENCY-FLEXIBLE, SUPERCONDUCTING QUANTUM PROCESSOR ARCHITECTURE

BACKGROUND

The currently claimed embodiments of the present invention relate to superconducting quantum processors, and more specifically, to a modular superconducting quantum processor and a quantum computer using the same and methods for making the modular superconducting quantum processor.

Quantum computation is based on the reliable control of quantum bits (referred to herein throughout as qubits). The fundamental operations required to realize quantum algorithms are a set of single-qubit operations and two-qubit operations which establish correlations between two separate quantum bits. The realization of high fidelity two-qubit operations may be desirable both for reaching the error threshold for quantum computation, and for reaching reliable quantum simulations.

The superconducting quantum processor (or superconducting qubit) includes superconducting metals (e.g., Al, Nb, etc.) on an insulating substrate (e.g., Si or high resistivity Si, $Al_2O_3$, etc.). The quantum processor is typically a planar two-dimensional lattice structure of individual qubits linked by a coupler in various lattice symmetry (for example, square, hexagonal, etc.), and a readout structure located on a flip-chip. The couplers can be made of a capacitor, a resonator, a coil or any microwave component that provides a coupling between qubits.

In order to connect input/out signal cables or lines, the quantum processor is packaged in a substrate (e.g., a printed circuit board (PCB)). The materials for the PCB can be, for example, FR4 laminate, ceramic, etc. FR4 is a versatile glass-reinforced epoxy laminate material. FR4 is a composite material having woven fiberglass cloth with an epoxy resin binder. The designation FR4 is created by the National Electrical Manufacturers Association (NEMA).

When the quantum process scales up, as future quantum computers may use a large number of qubits (hundreds to thousands, or more), it may be desirable to address many issues or problems that may occur due to the scaling factor. The various issues that may occur include spurious resonant modes that may be associated with the size of chip, frequency arrangement between qubits to cause cross-talk, and limited fabrication technologies to process growing chip sizes with a large number.

Conventional flipchip technology can be used with qubit chips. However, conventional flipchip methods do not provide frequency flexibility in connecting qubits. Therefore, a need remains for improved quantum processors and methods of producing or assembling the quantum processors.

SUMMARY

An aspect of the present invention is to provide a modular superconducting quantum processor. The modular superconducting quantum processor includes a first superconducting chip comprising a first plurality of qubits each having substantially a first resonance frequency and a second plurality of qubits each having substantially a second resonance frequency, the first resonance frequency being different from the second resonance frequency; a second superconducting chip comprising a third plurality of qubits each having substantially the first resonance frequency and a fourth plurality of qubits each having substantially the second resonance frequency; and an interposer chip connected to said first superconducting chip and to said second superconducting chip, wherein the interposer chip comprises interposer coupler elements configured to couple the second plurality of qubits having substantially the second resonance frequency to the fourth plurality of qubits having substantially the second resonance frequency.

Another aspect of the present invention is to provide a method of making a modular superconducting quantum processor. The method includes providing a first superconducting chip, the first superconducting chip comprising a first plurality of qubits each having substantially a first resonance frequency and a second plurality of qubits each having substantially a second resonance frequency, the first resonance frequency being different from the second resonance frequency; providing a second superconducting chip, the second superconducting chip comprising a third plurality of qubits each having substantially the first resonance frequency and a fourth plurality of qubits each having substantially the second resonance frequency; providing an interposer chip comprising interposer coupler elements configured to couple the second plurality of qubits having substantially the second resonance frequency to the fourth plurality of qubits having substantially the second resonance frequency; mounting the first superconducting chip and the second superconducting chip on a substrate; and mounting the interposer chip on at least a portion of the first superconducting chip, on at least a portion of the second superconducting chip, and on at least a portion of the substrate such that the first plurality of qubits, the second plurality of qubits, the third plurality of qubits and the fourth plurality of qubits are accessible from a side opposite to a side facing the substrate.

A further aspect of the present invention is to provide a quantum computer comprising a modular superconducting quantum processor. The modular superconducting quantum processor includes a first superconducting chip comprising a first plurality of qubits each having substantially a first resonance frequency and a second plurality of qubits each having substantially a second resonance frequency, the first resonance frequency being different from the second resonance frequency; a second superconducting chip comprising a third plurality of qubits each having substantially the first resonance frequency and a fourth plurality of qubits each having substantially the second resonance frequency; and an interposer chip connected to said first superconducting chip and to said second superconducting chip, wherein the interposer chip comprises interposer coupler elements configured to couple the second plurality of qubits having substantially the second resonance frequency to the fourth plurality of qubits having substantially the second resonance frequency.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
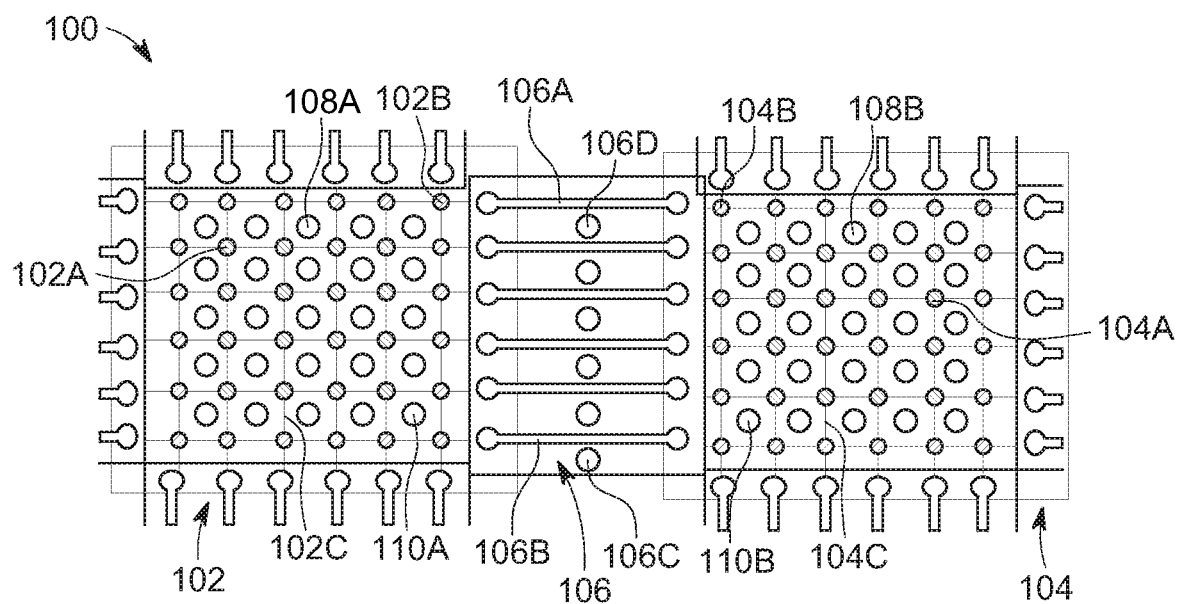
FIG. 1 is a schematic top view of a modular superconducting quantum processor, according to an embodiment of the present invention.

FIG. 1 is a schematic top view of a modular superconducting quantum processor 100, according to an embodiment of the present invention. The modular superconducting quantum processor 100 includes a first superconducting chip 102 and a second superconducting chip 104. The first superconducting chip 102 includes a first plurality of qubits 102A each having substantially a first resonance frequency and a second plurality of qubits 102B each having substantially a second resonance frequency. The first resonance frequency is different from the second resonance frequency. The terms "first resonance frequency" and "second resonance frequency" should be understood to broadly mean a first resonance frequency range and a second resonance frequency range, respectively. In an embodiment, for example, the second resonance frequency can be in the range 4.8-5.0 GHz and the first resonance frequency can be in the range 5.6-5.8 GHz or vice versa. The second superconducting chip 104 includes a third plurality of qubits 104A each having substantially the first resonance frequency and a fourth plurality of qubits 104B each having substantially the second resonance frequency.

In an embodiment, the first plurality of qubits 102A and the third plurality of qubits 104A are arranged in frequency to implement cross-resonance (CR) gates. In an embodiment, the second plurality of qubits 102B and the fourth plurality of qubits 104B include tunable gates or resonance induced phase (RIP) gates, or both. In another embodiment, the second plurality of qubits 102B and the fourth plurality of qubits 104B include tunable qubits (for example, asymon, WTQ, etc.). However, in addition to having different frequencies, the qubits can also be made of different materials and/or have different structure, or both.

In an embodiment, the second plurality of qubits 102B are arranged at a periphery in the first superconducting chip 102 and the fourth plurality of qubits 104B are arranged at a periphery of the second superconducting chip 104 so as to enable coupling between the second plurality of qubits 102B and the fourth plurality of qubits 104B.

The modular superconducting quantum processor 100 also includes an interposer chip 106 connected to the first superconducting chip 102 and to the second superconducting chip 104. The interposer chip 106 has interposer coupler elements 106A configured to couple the second plurality of qubits 102B having substantially the second resonance frequency to the fourth plurality of qubits 104B having substantially the second resonance frequency. In an embodiment, the interposer coupler elements 106A includes microwave lines 106B configured to couple the second plurality of qubits 102B to the fourth plurality of qubits 104B. In an embodiment, the interposer coupler elements 106A further includes drive lines 106C. The drive lines 106C can also be used to further couple the second plurality of qubits 102B to the fourth plurality of qubits 104B.

In an embodiment, the first superconducting chip 102 further includes a first plurality of coupling elements 102C configured to couple the first plurality of qubits 102A with the second plurality of qubits 102B. In an embodiment, the second superconducting chip 104 further includes a second plurality of coupling elements 104C configured to couple the third plurality of qubits 104A with the fourth plurality of qubits 104B. In an embodiment, the first plurality of coupling elements 102C and/or the second plurality of coupling elements 104C include anyone of resonators, direct capacitive coupler, or tunable frequency elements (e.g., a superconducting quantum interference device (SQUID), etc.), or any combination thereof.

In an embodiment, the first superconducting chip 102 and the second superconducting chip 104 comprise readout elements 108A, 108B to readout each of the first plurality of qubits 102A, each of the second plurality of qubits 102B, each of the third plurality of qubits 104A, or each of the fourth plurality of qubits 104B, or to readout any combination thereof. In embodiment, the first superconducting chip 102 and the second superconducting chip 104 may also include ground elements 110A, 110B configured to connect ground planes of the first superconducting chip 102 and the second superconducting chip 104.

In an embodiment, the interposer chip 106 may also include ground elements 106D configured to connect ground planes on the interposer chip 106.

Figure 2:
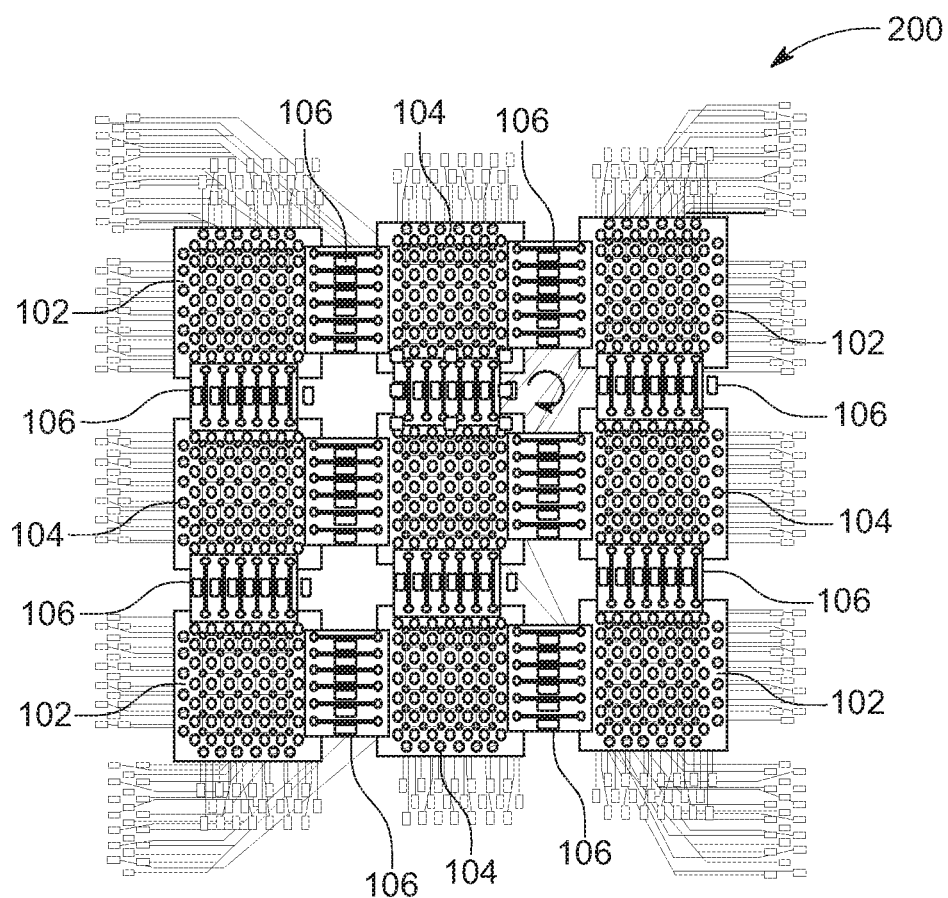
FIG. 2 is a schematic top-view of a modular superconducting quantum processor 200, according to another embodiment of the present invention.

FIG. 2 is a schematic top-view of a modular superconducting quantum processor 200, according to another embodiment of the present invention. In this embodiment, the modular superconducting quantum processor 200 includes a plurality of first superconducting chips 102 comprising the first plurality of qubits 102A and the second plurality of qubits 102B (shown in FIG. 1) and a plurality of second superconducting chips 104 comprising the third plurality of qubits 104A and the fourth plurality of qubits 104B (shown in FIG. 1). The modular superconducting quantum processor 200 also includes the interposer chip 106 that is configured to connect to the plurality of first superconducting chips 102 and to the plurality of second superconducting chips 104. Therefore, the interposer chip 106 can connect two chips 102, 104 or more.

Figure 3A:
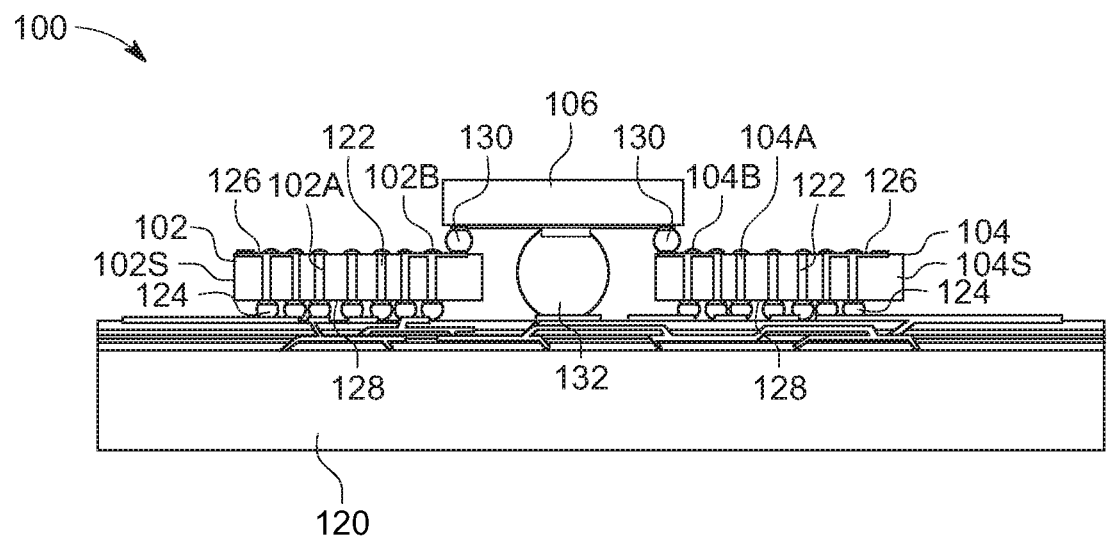
FIG. 3A is a schematic lateral cross-sectional view of the modular superconducting quantum processor shown in FIG. 1, according to an embodiment of the present invention.

FIG. 3A is a schematic lateral cross-sectional view of the modular superconducting quantum processor 100, according to an embodiment of the present invention. In FIG. 2, same reference numerals as in FIG. 1 are used to indicate same components of the modular superconducting quantum processor 100. As shown in FIG. 2, the modular superconducting quantum processor 100 further includes a substrate 120.

The first and second superconducting chips 102 and 104 are mounted to the substrate 120. In an embodiment, the first plurality of qubits 102A, the second plurality of qubits 102B, the third plurality of qubits 104A and the fourth plurality of qubits 104B are connected to the substrate 120 through a plurality of vias 122 and solder bumps 124. In an embodiment, the plurality of vias 122 are configured to input and output signals to the first plurality of qubits 102A, second plurality of qubits 102B, third plurality of qubits 104A and fourth plurality of qubits 104B through the substrate 120.

In an embodiment, the first superconducting chip 102 and second superconducting chip 104 are mounted to the substrate 120 so as to allow free access to the first plurality of qubits 102A, the second plurality of qubits 102B, the third plurality of qubits 104A, and the fourth plurality of qubits 104B from a side 126 of the first and second superconducting chips 102, 104 that is opposite a side 128 of the first and second superconducting chips 102, 104 facing the substrate 120. As a result, this architecture has the benefit of providing accessibility to the top of the superconducting chip 102, 104 unlike a flip-chip. This is rendered possible because the first superconducting chip 102 and the second superconducting chip 104 are connected or bump bonded using solder bumps 124 to the substrate 120 through vias 122. As a result, by providing access to qubits from the top of the superconducting chip this allows qubit modification, for example, by frequency tuning the qubit devices (for example by using LASIQ and/or magnetic techniques).

In an embodiment, input and output signals are coming from the side 128 (backside) facing the substrate 120 through vias 122. In an embodiment, the first plurality of qubits 102A, the second plurality of qubits 102B of the first superconducting chip 102, and the third plurality of qubits 14A and the fourth plurality of qubits 104B of the second superconducting chip 104 are provided on an insulating (non-conductor) substrate 102S, 104S, respectively. The insulating substrate can be for example made of high resistivity Si, $Al_2O_3$, etc. In an embodiment, the vias 122 are formed in the insulating substrate (for example high resistivity Si, $Al_2O_3$). When the vias 122 are formed within an Si substrate the vias are referred to as through silicon vias (TSV).

In an embodiment, the first superconducting chip 102, the second superconducting chip 104, and the interposer chip 106 are configured and arranged to provide a modular system so as to enable direct accessibility to each of the first plurality of qubits 102A, second plurality of qubits 102B, third plurality of qubits 104A and fourth plurality of qubits 104B. In an embodiment, the interposer chip 106 is connected to the first and second superconducting chips 102, 104 using solder bumps 130 and connected to the substrate 120 using solder bump 132.

Figure 3B:
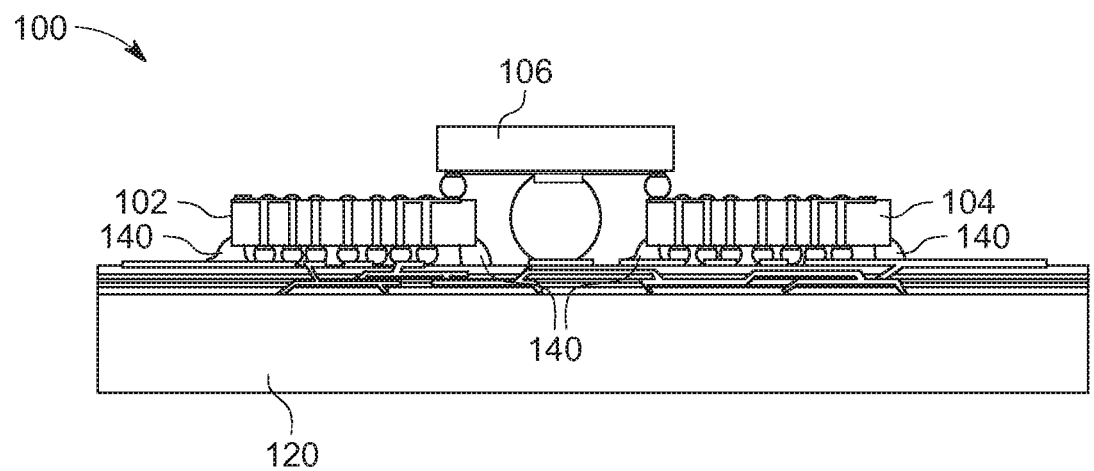
FIG. 3B is a schematic lateral cross-sectional view of the modular superconducting quantum processor shown in FIG. 1, according to another embodiment of the present invention.

FIG. 3B is a schematic lateral cross-sectional view of the modular superconducting quantum processor 100, according to another embodiment of the present invention. The superconducting quantum processor 100 shown in FIG. 3B is similar in many aspects to the superconducting quantum processor 100 shown in FIG. 3A. Therefore, a description of common features is not repeated herein. One difference between the embodiment shown in FIG. 3A and FIG. 3B is the addition of support features 140 to provide additional support to the first and second superconducting chips 102 and 104. The support features 140 provide additional mechanical support to the first superconducting chip 102 and the second superconducting chip 104 for enhanced sturdiness and stability.

Figure 4A:
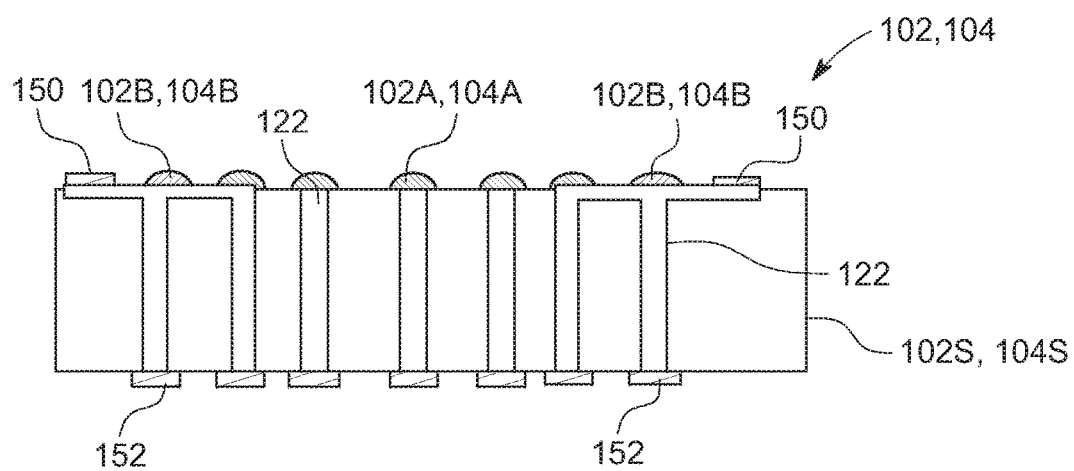
FIG. 4A is a detailed schematic lateral view of the first or second superconducting chip shown in FIGS. 3A and 3B, according to an embodiment of the present invention.
Figure 5A:
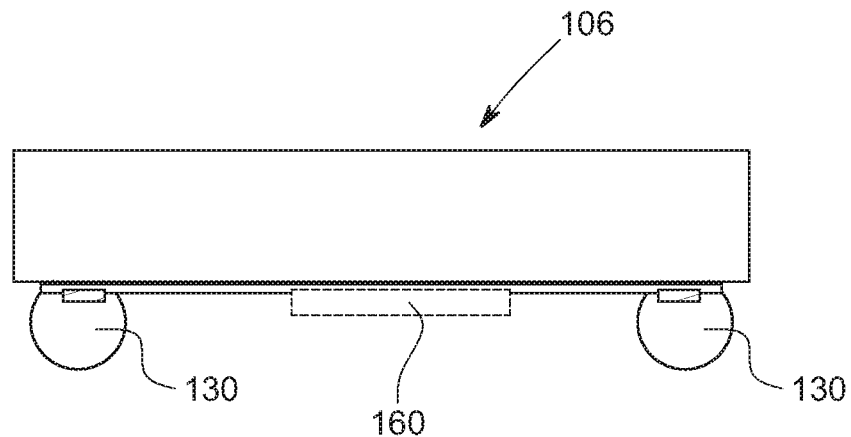
FIG. 5A is a detailed schematic lateral view of the interposer chip shown in FIGS. 3A and 3B, according to an embodiment of the present invention.

FIG. 4A is a detailed schematic lateral view of the first or second superconducting chip 102, 104, according to an embodiment of the present invention. FIG. 5A is a detailed schematic lateral view of the interposer chip 106, according to an embodiment of the present invention. In addition, to the various features described in the above paragraphs with respect to FIGS. 3A and 3B, FIG. 4A shows in more detail the vias 122 formed in the insulating substrate 102S, 104S of the first and second superconducting chip 102, 104. The vias 122 can be filled or coated with a conductor (e.g., metal). In addition, an under bump metallurgy (UBM) 150 is also shown. The UBM 150 is provided to join the first and second superconducting chips 102, 104 to the interposer chip 106 through solder bumps 130, shown in FIG. 5A. In addition, another UBM 152 is provided at an end of the vias 122 to join to solder bumps 124 on the substrate 120, as shown in FIG. 3A. As shown in FIG. 5A, the interposer chip 106 also includes pad 160 for bonding the interposer chip 106 to the substrate 120 (e.g., PCB) via solder bump 132, as shown in FIG. 3A.

Figure 4B:
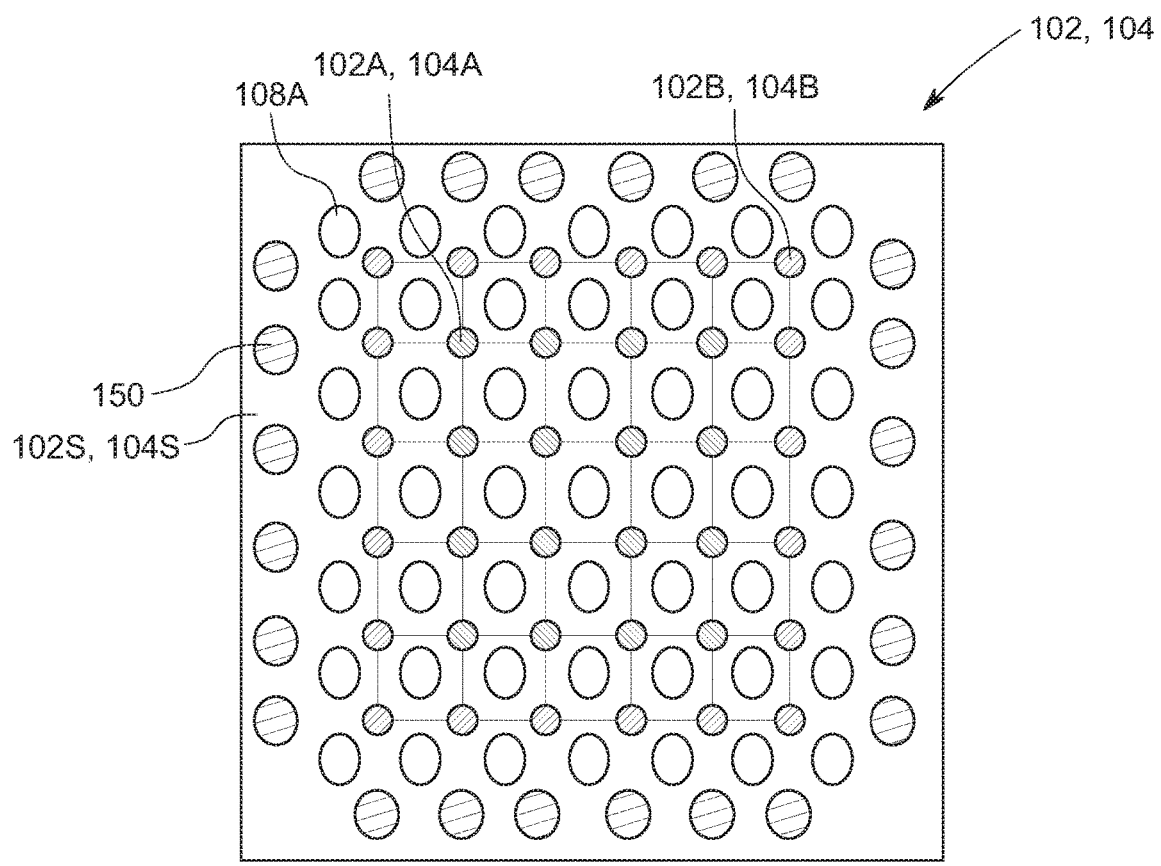
FIG. 4B is a top view of the first or second superconducting chip, according to an embodiment of the present invention.
Figure 5B:
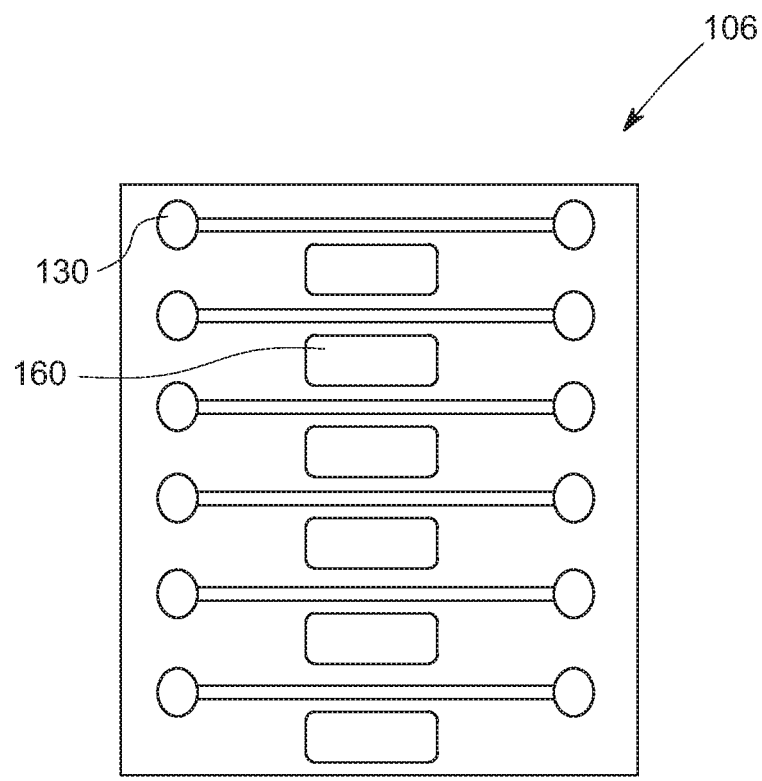
FIG. 5B is a top view of the interposer chip, according to an embodiment of the present invention.

FIG. 4B is a top view of the first or second superconducting chip 102, 104, according to an embodiment of the present invention. FIG. 5B is a top view of the interposer chip 106, according to an embodiment of the present invention. FIG. 4B shown in more detail the arrangement of the qubits 102A, 102B, 104A, 104B. For example, the qubits are shown arranged in matrix arrangement. However, as it must be appreciated, the qubits can also be arranged in a different arrangement or configuration, for example another polygonal architecture. In an embodiment, the UBM 150 provided to join the first and second superconducting chips 102, 104 to the interposer chip 106 through solder bumps 130 are arranged at the periphery of the first and second superconducting chip 102, 104. In an embodiment, the shape of the first and second superconducting chip 102, 104 is rectangular, as shown in FIG. 4B. Hence, an interposer chip 106 can be connected to each side of the rectangular shaped first and second superconducting chip 102, 104 using the UBM 150 on the superconducting chip 102, 104 and solder bumps 130 on the interposer chip or interposer chips 106. Each first superconducting chip 102 and Each second superconducting chip 104 together with the interposer chip linking them form a module that is attached to substrate 120 (e.g., PCB). It is also contemplated to provide a first and second superconducting chips 102, 104 with a different polygonal shape (such as triangular, pentagonal, hexagonal, etc. . . . ). In this case, each side of the polygonal shaped first and second superconducting chips 102, 104 can be connected to an interposer chip 106 via UBM 150 on the superconducting chips 102, 104 and solder bumps 130 on the interposer chip or interposer chips 106.

As shown in FIG. 5B, the interposer chip 120 has a plurality of solder bumps 130 configured to link with corresponding UBM 150 on the first and second superconducting chips 102, 104. In addition, the interposer chip 106 also includes the interposer chip 106 also includes pad 160 for bonding the interposer chip 106 to the substrate 120 (e.g., PCB) via solder bump 132, as shown in FIG. 3A.

The present quantum computer processor architecture, according to an embodiment of the present invention, has a modular architecture in that, for example, the superconducting qubits 102A, 104A, 102B and 104B are configured to optimize the frequency arrangement condition using, for example, hybrid gate schemes inter-chips and intra-chips within the processor. In addition, in an embodiment, the modular architecture of the present quantum computer processor enables repairing, servicing or modifying the processor by only repairing, servicing or modifying a target chip without compromising the entire quantum computer processor device. Furthermore, the use of vias (e.g., TSVs) enables access to a qubit from the top, which enables post-processing the qubits and testing the qubits. For example, this can be performed for room temperature measurements, annealing and/or further qubit tuning. The modular architecture of the present quant quantum computer processor, according to an embodiment of the present invention, also provide a reduction in a probability of chip mode coupling to qubits through vias (e.g., TSVs).

Figure 6:
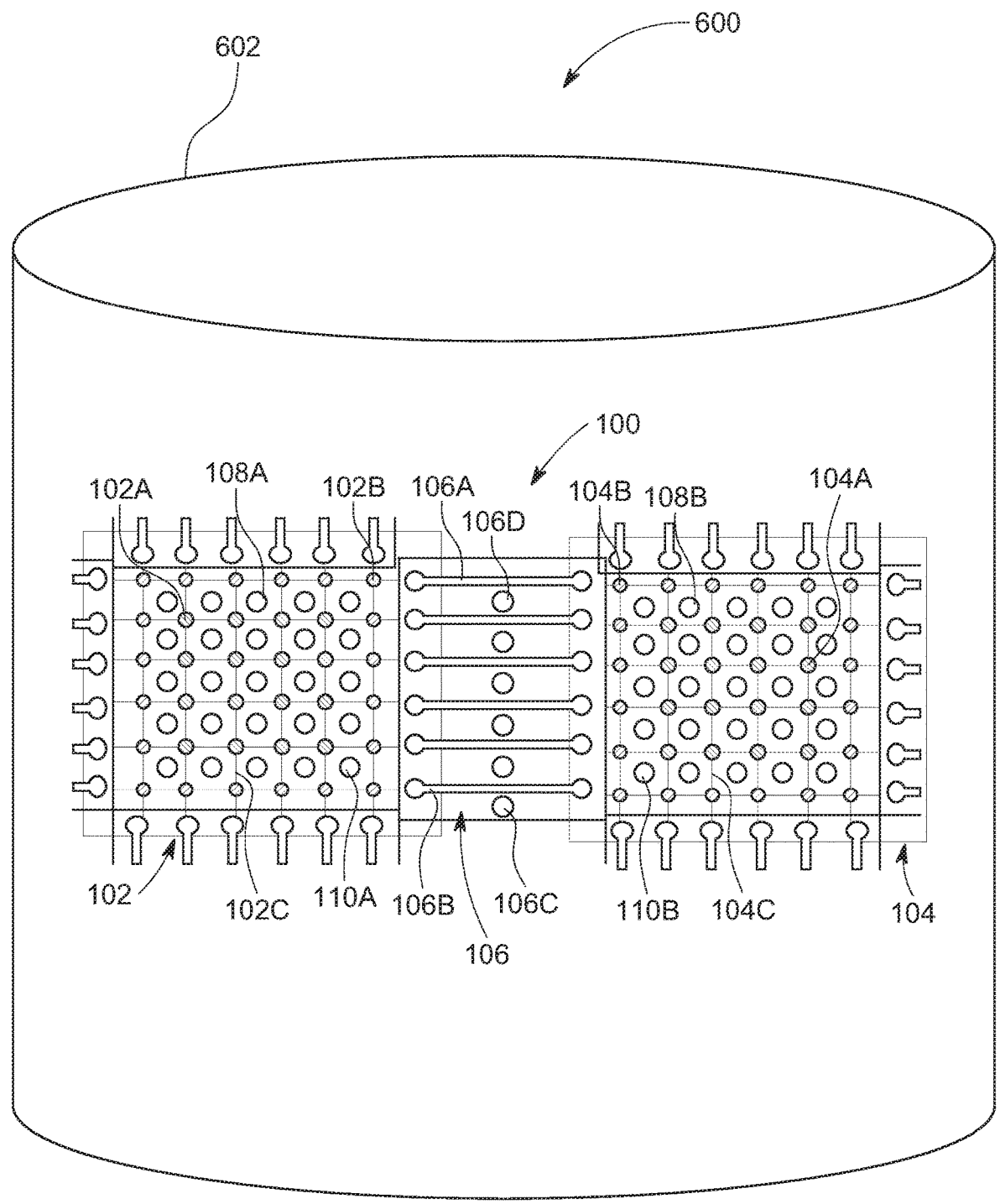
FIG. 6 is a schematic illustration of a quantum computer, according to an embodiment of the present invention.

As it can be appreciated from the above paragraphs, in an embodiment, there is also provided a quantum computer having a modular superconducting quantum processor. FIG. 6 is a schematic illustration of a quantum computer 600, according to an embodiment of the present invention. The quantum computer 600 includes a refrigeration system under vacuum including a containment vessel 602. The quantum computer 600 includes a modular superconducting quantum processor 100. The modular superconducting quantum processor 100 is disposed inside the containment vessel 602. The modular superconducting quantum processor 100 includes a first superconducting chip 102A including a first plurality of qubits 102A each having substantially a first resonance frequency and a second plurality of qubits 102B each having substantially a second resonance frequency, the first resonance frequency being different from the second resonance frequency. The modular superconducting quantum processor 100 also includes a second superconducting chip 104 including a third plurality of qubits 104A each having substantially the first resonance frequency and a fourth plurality of qubits 104B each having substantially the second resonance frequency. The modular superconducting quantum processor 100 further includes an interposer chip 106 connected to the first superconducting chip 102 and to the second superconducting chip 104. The interposer chip 106 includes interposer coupler elements configured to couple the second plurality of qubits 102B having substantially the second resonance frequency to the fourth plurality of qubits 104B having substantially the second resonance frequency.

Figure 7:
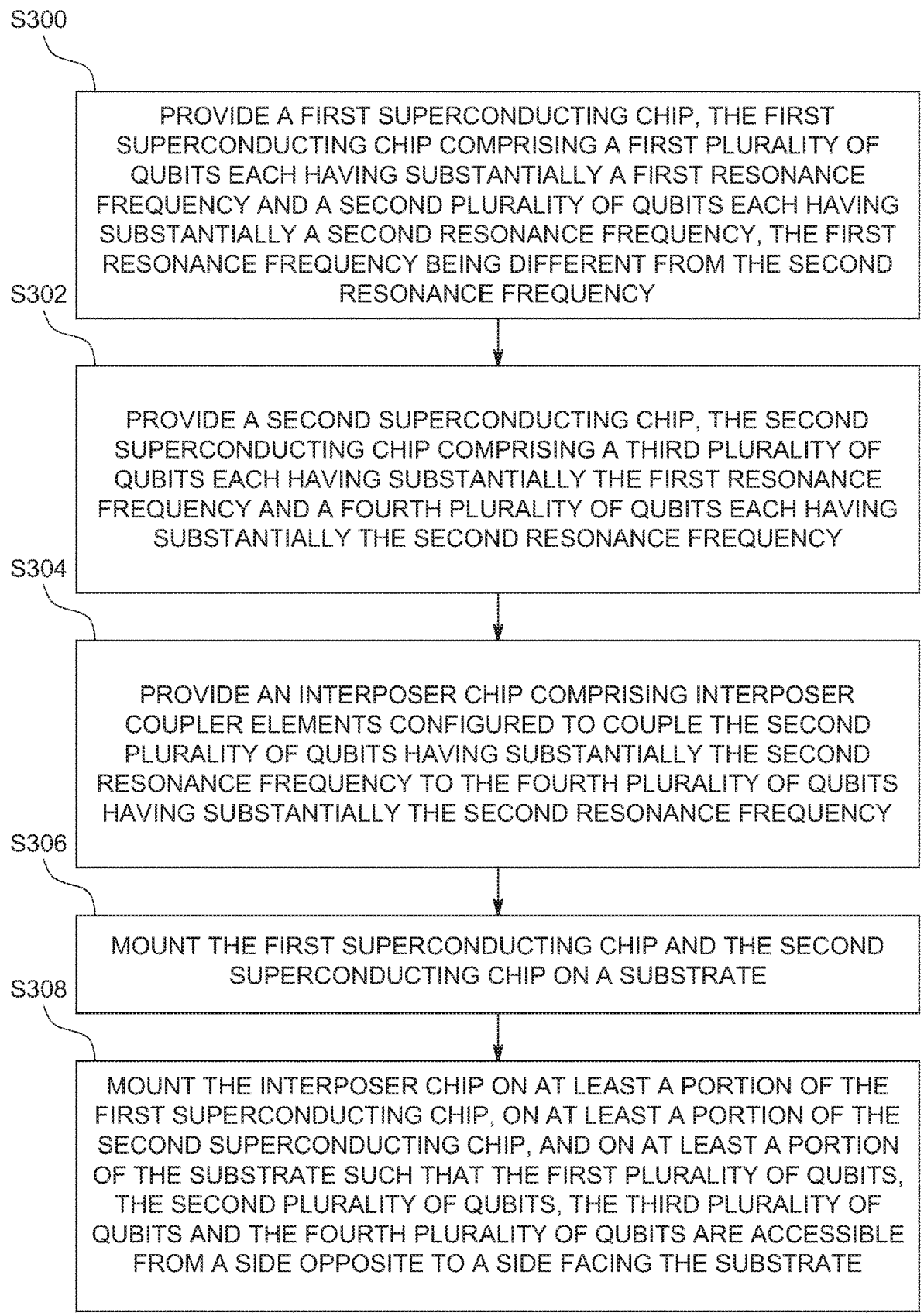
FIG. 7 is a flow chart of a method for making a quantum processor, according to an embodiment of the present invention.

As it can be appreciated from the above paragraphs, a method is also provided for making a quantum processor. FIG. 7 is a flow chart of the method for making a quantum processor 100, according to an embodiment of the present invention. The method includes providing the first superconducting chip 102, the first superconducting chip 102 having a first plurality of qubits 102A each having substantially a first resonance frequency and a second plurality of qubits 102B each having substantially a second resonance frequency, the first resonance frequency being different from the second resonance frequency, at S300. The method also includes providing a second superconducting chip 104, the second superconducting chip 104 having a third plurality of qubits 104A each having substantially the first resonance frequency and a fourth plurality of qubits 104B each having substantially the second resonance frequency, at S302. The method also includes providing an interposer chip 106 including interposer coupler elements configured to couple the second plurality of qubits 102B having substantially the second resonance frequency to the fourth plurality of qubits 104B having substantially the second resonance frequency, at S304.

The method further includes mounting the first superconducting chip 102 and the second superconducting chip 104 on a substrate 120, at S306. The method also includes mounting the interposer chip 106 on at least a portion of the first superconducting chip 102, on at least a portion of the second superconducting chip 104, and on at least a portion of the substrate 120 such that the first plurality of qubits 102A, the second plurality of qubits 102B, the third plurality of qubits 104A and the fourth plurality of qubits 104B are accessible from a side opposite to a side facing the substrate 120, at S308.

In an embodiment, the method further includes conductively connecting the first plurality of qubits 102A, the second plurality of qubits 102B, the third plurality of qubits 104A and the fourth plurality of qubits 104B to the substrate 120 and conductively connecting the interposer chip 106 to the substrate 120 and to the first superconducting chip 102 and to the second superconducting chip 104.

In an embodiment, mounting the first superconducting chip 102 and the second superconducting chip 104 on the substrate 120 includes connecting the first, the second, the third and fourth plurality of qubits 102A, 102B, 104A and 104B to the substrate 120 using a plurality of vias 122 in the first and second superconducting chips 102 and 104 and solder bumps 124. In an embodiment, the plurality of vias 122 are configured to input and output signals to the first, second, third and fourth plurality of qubits 102A, 102B, 104A and 104B through the substrate 120.

In an embodiment, the method further includes producing the first plurality of qubits 102A and the second plurality of qubits 102B on a first substrate 102S to form the first superconducting chip 102, and producing the third plurality of qubits 104A and the fourth plurality of qubits 104B on a second substrate 104S to form the second superconducting chip 104.

In an embodiment, producing the first plurality of qubits 102A and the second plurality of qubits 102B on the first substrate 102S includes producing the first plurality of qubits 102A and the second plurality of qubits 102B on a first non-conductive (insulating) substrate 102S, and producing the third plurality of qubits 104A and the fourth plurality of qubits 104B on the second substrate 104S comprises producing the third plurality of qubits 104A and the fourth plurality of qubits 104B on a second non-conductive (insulating) substrate 104S.

In an embodiment, producing the first plurality of qubits 102A and the second plurality of qubits 102B on the first substrate 102S includes producing the second plurality of qubits 102B at a periphery in the first substrate 102S, and producing the third plurality of qubits 104A and the fourth plurality of qubits 104B on the second substrate 104S includes producing the fourth plurality of qubits 104B at a periphery of the second substrate 104S so as to enable conductive coupling between the second plurality of qubits 102B and the fourth plurality of qubits 104B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A modular superconducting quantum processor, comprising:

a first superconducting chip comprising a first plurality of qubits each having substantially a first resonance frequency and a second plurality of qubits each having substantially a second resonance frequency, the first resonance frequency being different from the second resonance frequency;

a second superconducting chip comprising a third plurality of qubits each having substantially the first resonance frequency and a fourth plurality of qubits each having substantially the second resonance frequency; and an interposer chip connected to said first superconducting chip and to said second superconducting chip, wherein the interposer chip comprises interposer coupler elements configured to couple the second plurality of qubits having substantially the second resonance frequency to the fourth plurality of qubits having substantially the second resonance frequency.

2. The modular superconducting quantum processor according to claim 1, wherein the second plurality of qubits are arranged at a periphery in the first superconducting chip and the fourth plurality of qubits are arranged at a periphery of the second superconducting chip so as to enable coupling between the second plurality of qubits and the fourth plurality of qubits.

3. The modular superconducting quantum processor according to claim 1, wherein the first superconducting chip further comprises a first plurality of coupling elements configured to couple the first plurality of qubits with the second plurality of qubits.

4. The modular superconducting quantum processor according to claim 1, wherein the second superconducting chip further comprises a second plurality of coupling elements configured to couple the third plurality of qubits with the fourth plurality of qubits.

5. The modular superconducting quantum processor according to claim 1, wherein the first superconducting chip and the second superconducting chip comprise readout elements to readout each of the first plurality of qubits, each of the second plurality of qubits, each of the third plurality of qubits or each of the fourth plurality of qubits or to readout any combination thereof.

6. The modular superconducting quantum processor according to claim 1, wherein the first superconducting chip and the second superconducting chip comprises ground elements configured to connect ground planes of the first superconducting chip and the second superconducting chip.

7. The modular superconducting quantum processor according to claim 1, wherein the interposer chip comprises ground elements configured to connect ground planes on the interposer chip.

8. The modular superconducting quantum processor according to claim 1, wherein the interposer coupler elements are selected from the group consisting of a resonator, a direct capacitive coupler, and a frequency tunable element.

9. The modular superconducting quantum processor according to claim 1, wherein the first plurality of qubits and the third plurality of qubits are arranged in frequency to implement cross-resonance (CR) gates.

10. The modular superconducting quantum processor according to claim 1, wherein the second plurality of qubits and the fourth plurality of qubits comprise tunable gates or resonance induced phase (RIP) gates.

11. The modular superconducting quantum processor according to claim 1, further comprising a substrate, wherein the first and second superconducting chips are mounted to the substrate and the first plurality of qubits, the second plurality of qubits, the third plurality of qubits, and the fourth plurality of qubits are connected to the substrate through a plurality of vias and solder bumps, wherein the plurality of vias are configured to input and output signals to the first, second, third and fourth plurality of qubits through the substrate.

12. The modular superconducting quantum processor according to claim 11, wherein the first and second superconducting chips are mounted to the substrate so as to allow free access to the first, second, third and fourth plurality of qubits from a side of the first and second superconducting chips that is opposite a side of the first and second superconducting chips facing the substrate.

13. The modular superconducting quantum processor according to claim 11, wherein the interposer chip is connected to the first and second superconducting chips and the substrate using solder bumps.

14. The modular superconducting quantum processor according to claim 1, wherein the first superconducting chip, the second superconducting chip, and the interposer chip are configured and arranged to provide a modular system so as to enable direct accessibility to each of the first, second, third and fourth qubits.

15. The modular superconducting quantum processor according to claim 1, further comprising:
   a plurality of first superconducting chips comprising the first plurality of qubits and the second plurality of qubits;
   a plurality of second superconducting chips comprising the third plurality of qubits and the fourth plurality of qubits,
   wherein the interposer chip is configured to connect to said plurality of first superconducting chips and to said plurality of second superconducting chips.

16. A method of making a modular superconducting quantum processor, comprising:
   providing a first superconducting chip, the first superconducting chip comprising a first plurality of qubits each having substantially a first resonance frequency and a second plurality of qubits each having substantially a second resonance frequency, the first resonance frequency being different from the second resonance frequency;
   providing a second superconducting chip, the second superconducting chip comprising a third plurality of qubits each having substantially the first resonance frequency and a fourth plurality of qubits each having substantially the second resonance frequency;
   providing an interposer chip comprising interposer coupler elements configured to couple the second plurality of qubits having substantially the second resonance frequency to the fourth plurality of qubits having substantially the second resonance frequency;
   mounting the first superconducting chip and the second superconducting chip on a substrate; and
   mounting the interposer chip on at least a portion of the first superconducting chip, on at least a portion of the second superconducting chip, and on at least a portion of the substrate such that the first plurality of qubits, the second plurality of qubits, the third plurality of qubits and the fourth plurality of qubits are accessible from a side opposite to a side facing the substrate.

17. The method according to claim 16, further comprising conductively connecting the first plurality, the second plurality, the third plurality and the fourth plurality of qubits to the substrate and conductively connecting the interposer chip to the substrate and to the first superconducting chip and to the second superconducting chip.

18. The method according to claim 16, wherein mounting the first superconducting chip and the second superconducting chip on the substrate comprises connecting the first, the second, the third and fourth plurality of qubits to the substrate using a plurality of vias in the first and second superconducting chips and solder bumps, wherein the plurality of vias are configured to input and output signals to the first, second, third and fourth plurality of qubits through the substrate.

19. The method according to claim 16, further comprising producing the first plurality of qubits and the second plurality of qubits on a first substrate to form the first superconducting chip; and producing the third plurality of qubits and the fourth plurality of qubits on a second substrate to form the second superconducting chip.

20. The method according to claim 19, wherein producing the first plurality of qubits and the second plurality of qubits on the first substrate comprises producing the first plurality of qubits and the second plurality of qubits on a first non-conductive substrate, wherein producing the third plurality of qubits and the fourth plurality of qubits on the second substrate comprises producing the third plurality of qubits and the fourth plurality of qubits on a second non-conductive substrate.

21. The method according to claim 19, wherein producing the first plurality of qubits and the second plurality of qubits on the first substrate comprises producing the second plurality of qubits at a periphery in the first substrate, and wherein producing the third plurality of qubits and the fourth plurality of qubits on the second substrate comprises producing the fourth plurality of qubits at a periphery of the second substrate so as to enable conductive coupling between the second plurality of qubits and the fourth plurality of qubits.

22. A quantum computer comprising a modular superconducting quantum processor, wherein the modular superconducting quantum processor comprises:

a first superconducting chip comprising a first plurality of qubits each having substantially a first resonance frequency and a second plurality of qubits each having substantially a second resonance frequency, the first resonance frequency being different from the second resonance frequency;

a second superconducting chip comprising a third plurality of qubits each having substantially the first resonance frequency and a fourth plurality of qubits each having substantially the second resonance frequency; and an interposer chip connected to said first superconducting chip and to said second superconducting chip, wherein the interposer chip comprises interposer coupler elements configured to couple the second plurality of qubits having substantially the second resonance frequency to the fourth plurality of qubits having substantially the second resonance frequency.

* * * * *